United States Patent [19]

Howard et al.

[11] 4,092,551

[45] May 30, 1978

[54] A.C. POWERED SPEED UP CIRCUIT

[75] Inventors: Donald Dunbar Howard, Underhill Center, Vt.; Helmut Schettler, Boeblingen, Germany

[73] Assignee: International Business Machines Corporation, Armonk, N.Y.

[21] Appl. No.: 688,220

[22] Filed: May 20, 1976

[51] Int. Cl.² .......................................... H03K 17/00
[52] U.S. Cl. .................................. 307/254; 307/214; 307/270; 307/300
[58] Field of Search ............... 307/246, 300, 270, 254, 307/214; 330/25

[56] References Cited

U.S. PATENT DOCUMENTS

| | | | |
|---|---|---|---|
| 3,614,467 | 10/1971 | Tu | 307/300 |
| 3,656,004 | 4/1972 | Kemerer et al. | 307/300 |
| 3,958,136 | 5/1976 | Schroeder | 307/300 |
| 3,979,607 | 9/1976 | Beelitz et al. | 307/300 |

Primary Examiner—Stanley D. Miller, Jr.
Assistant Examiner—B. P. Davis
Attorney, Agent, or Firm—Francis J. Thornton

[57] ABSTRACT

An improved speed up circuit, especially useful with high speed, push pull circuits, is disclosed. This uses only A.C. power to discharge the interelectrode and depletion capacitances of an output transistor thereby eliminating uncontrolled shunt current from the output to ground through the output transistor thereby allowing the output to reach the desired level in a shorter period of time. These desirable results are accomplished by capacitively coupling a resistor-transistor speed up circuit to the base of the output transistor to actively pull the base of the output transistor to ground and discharge the inherent interelectrode and depletion capacitances of the output transistor.

7 Claims, 4 Drawing Figures

A.C. POWERED SPEED UP CIRCUIT

BACKGROUND OF THE INVENTION

1. Field of the Invention

The invention relates generally to the field of electrical circuits and more particularly to high speed push pull circuits having speed up circuits coupled thereto.

2. Description of the Prior Art

High speed push pull circuits such as interface drivers are well known to the prior art and generally have slow rise times due to relatively high value pull up resistors and low voltages.

In each of these circuits high speed operation is desired especially when such circuits are used in memory configurations where speed of the circuit is a critical factor. However, in transistor circuits there exists various capacitances, such as stray capacitance, depletion capacitances resulting from the natural unavoidable depletions formed in the device during operation and the unavoidable interelectrode capacitances that mutually links the terminals of a transistor. Because these capacitances, hereinafter referred to collectively as the interelectrode capacitances are so significant they are disruptive and can cause uncontrolled and undesired shunting currents to be passed through transistors causing variations in the output of the circuit and subsequent losses of speed before the output voltage of the circuit is stabilized in its steady state condition.

In push pull circuits this problem caused by this interelectrode capacitance is especially acute because it can significantly delay the response of the pull down transistor and thus delay the response of the output.

In the prior art, common methods of removing this interelectrode capacitance were to apply a reverse current to the base terminal of the output transistor or to include a parallel resistor-capacitor combination in the base circuit of the transistor. Both solutions leave much to be desired and indeed in some instances it can interject additional problems into the operation of the circuit.

In U.S. Pat. No. 3,789,241 there is described a circuit for rapidly removing excess stored minority carriers from the base region of a saturated transistor and rapid charging of the interelectrode capacitance of this transistor by a pull down transistor. This patent describes a solution which is very desirable in many circuits. However, this circuit suffers the drawback that it requires additional D.C. power to the pull down transistor in order to maintain the output in a high state. Thus in circuits where D.C. power is limited such a solution is not satisfactory.

U.S. Pat. No. 3,681,619 teaches that means can be provided in electronic circuits for canceling stray direct current outputs in the circuits by means of an injected transistor feeding an impedance which connects the injected transistor to the output circuit. Again, however, although the solution depicted is desirable in some circuits, it will also require additional D.C. power to be supplied to the pull down transistor in order to maintain the output in a high state.

Both of the above described prior art solutions are therefore unsatisfactory in situations where it is necessary to achieve fast high speed stable outputs with limited D.C. power.

None of the above described prior art suggested the introduction of a speed up circuit, in such circuits, which would contribute to fast rise times of the output and virtual elimination of uncontrolled and undesired shunt currents from the output to ground through the pull down transistor that would utilize only the A.C. power of the circuit and that would not require the use of D.C. power to operate.

SUMMARY OF THE INVENTION

Broadly speaking the present invention teaches a unique circuit for reliably and unambiguously discharging the interelectrode capacitance inherent in the pull down transistor of a transistor circuit.

The circuit of the invention is also unique and particularly designed so as to utilize only A.C. power to discharge this interelectrode capacitance of the pull down transistor and not to require the comsumption of D.C. power. The circuit of the invention thus overcomes the drawbacks of all the known prior art speed up circuits utilized in such electronic apparatus and further avoids the requirements of utilizing additional power.

The present invention is best realized by the addition of a capacitively coupled resistor-transistor circuit connected to the base of the pull down transistor so as to discharge the inherent interelectrode capacitance of the pull down transistor.

DESCRIPTION OF THE DRAWINGS

These and other features, advantages and object of the present invention will be more fully appreciated from the following detailed description of a preferred embodiment of the invention taking in conjunction with the accompanying drawings in which.

DESCRIPTION OF THE PREFERRED EMBODIMENT

Figure 1:
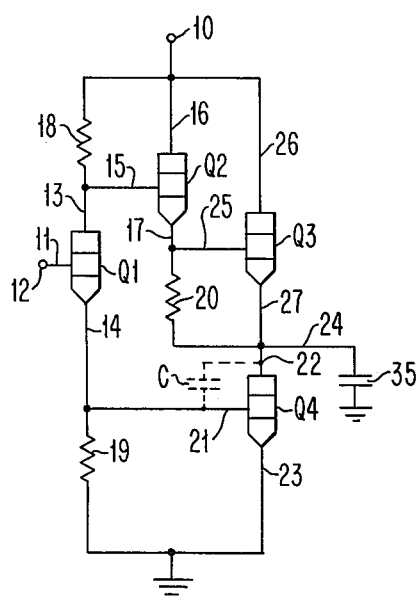
FIG. 1 schematically shows a prior art interface driver circuit having push pull amplification.

Referring now to the drawings a circuit employing the present invention will be described in detail as to its construction and mode of operation.

FIG. 1 illustrates in simplified form an NPN transistorized push pull amplifier circuit the principle features of the present invention. The push pull amplifier circuit shown here comprises an input transistor Q1 whose base 11 is coupled to a source of input signals 12 and whose collector 13 is coupled through a collector resistor 18 to a +V voltage source 10 and directly to the base 15 of a reference transistor Q2. The collector 16 of the reference transistor Q2 is coupled directly to the voltage source 10. The emitter 17 of transistor Q2 is coupled, through an emitter resistor 20 to an output line 24 and also directly to the base 25 of an emitter follower transistor Q3. The collector 26 of the emitter follower transistor Q3 is connected to the voltage source 10 while its emitter 27 is coupled directly to the output line 24.

Also coupled to the output line 24 is the collector 22 of a pull down transistor Q4. This pull down transistor Q4 has its emitter 23 coupled directly to ground and its base 21 connected to the emitter 14 of the transistor Q1 which is coupled through an emitter resistor 19 to ground. To the output line 24 is coupled a suitable load simulated by capacitor 35.

Figure 3:
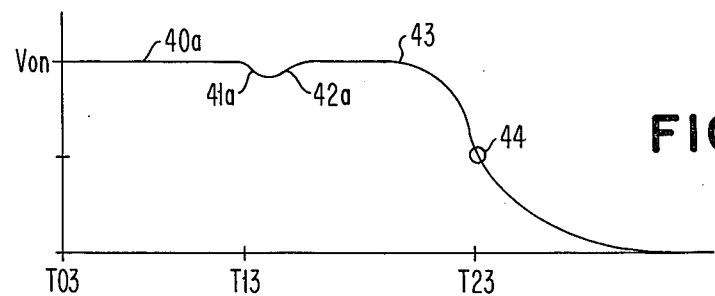
FIG. 3 is a plot of time vs the drive voltage at the base of the pull down transistor of the circuit of FIG. 1.

The operation of the circuit of FIG. 1 will be now described in conjunction with the drive voltage time plot curve illustrated in FIG. 3.

The curve shown in FIG. 3 depicts the drive voltage appearing at the base 21 of the pull down transistor Q4 when the speed up circuit of the invention is not used.

For purposes of example only, it will be assumed that at time T03 transistor Q1 initially has a positive voltage signal impressed upon its base 11 such that it is in a conductive state and current is flowing through it from the positive voltage source 10 to ground. This current flow causes the base 15 of transistor Q2 to be held low such that transistor Q2 is in a nonconductive state as is the emitter follower transistor Q3.

This same current flowing through transistor Q1 further holds the base 21 of transistor Q4 at a high voltage level $V_{on}$ as indicated by the initial portion 40a of the curve of FIG. 3. Because the base 21 of transistor Q4 is held high, the transistor Q4 is also conductive and the output line 24 is held at a low voltage, i.e. substantially ground. The output line 24 will remain at this low voltage level as long as the input signal supplied to the base 11 of transistor Q4 is sufficient to assure that transistor Q4 remains conductive.

The sequence for switching the output line 24 to a positive or high voltage level +V is as follows:

At time T13, shown in FIG. 3, the positive voltage signal impressed upon the base 11 of transistor Q1 is pulled negative an amount sufficient to render transistor Q1 nonconductive. When transistor Q1 becomes nonconductive its collector 13 and hence the base 15 of transistor Q2 rapidly rises toward the positive voltage level +V applied by source 10. This positive voltage appears as a D.C. pulse applied to the base 15 of transistor Q2 causing the transistor Q2 to become conductive pulling up the base 25 of the emitter follower transistor Q3 to cause transistor Q3 to also turn on and thus apply a positive voltage from the positive voltage source +V at the source 10 to the output line 24.

Simultaneously, as transistor Q1 becomes nonconductive its emitter 14 and the base 21 of transistor Q4 begins to be pulled toward ground by virtue of the emitter resistor 19 causing the drive voltage $V_{on}$ at the base 21 of transistor Q4 to begin to fall as indicated by the falling portion 41a of the curve of FIG. 3. The pull down transistor Q4 has a large interelectrode capacitance between its collector 22 and its base 21 here indicated by the capacitor C shown in phantom. This interelectrode capacitance acts as a source of drive voltage causing the base 21 of transistor Q4 to be pulled back up to $V_{on}$ as indicated by the rising portion 42a of the curve shown in FIG. 3. This interelectrode capacitance C is especially significant when the pull down Q4 transistor is a large power transistor. The action of the interelectrode capacitor C will continue to maintain transistor Q4 in a conductive condition, for a significant period of time, i.e. to time T23 as indicated by the portion 43 of the curve shown in FIG. 3, until at time T23 the charge stored in capacitance C is depleted a sufficient amount to permit transistor Q4 to turn off.

Of course, in the circuit shown in FIG. 1 the actual length of time transistor Q4 will remain on is a function of the value of resistor 19 and the size of the interelectrode capacitance C. However, in practical operating circuits of the type described it typically takes 25 nanoseconds from time T13 to time T23 for the drive voltage $V_{on}$ applied to the base 21 to be reduced sufficiently, usually about 265 millivolts, as indicated by numeral 44 on the curve shown in FIG. 3. When the drive voltage on the base 21 of the pull down transistor Q4 is so reduced the transistor Q4 is rendered nonconductive.

When the drive voltage at the base 21 of transistor Q4 finally falls low enough to turn off the transistor Q4 the output line becomes uncoupled from ground and is pulled up towards +V by the action of transistors Q2 and Q3.

Figure 2:
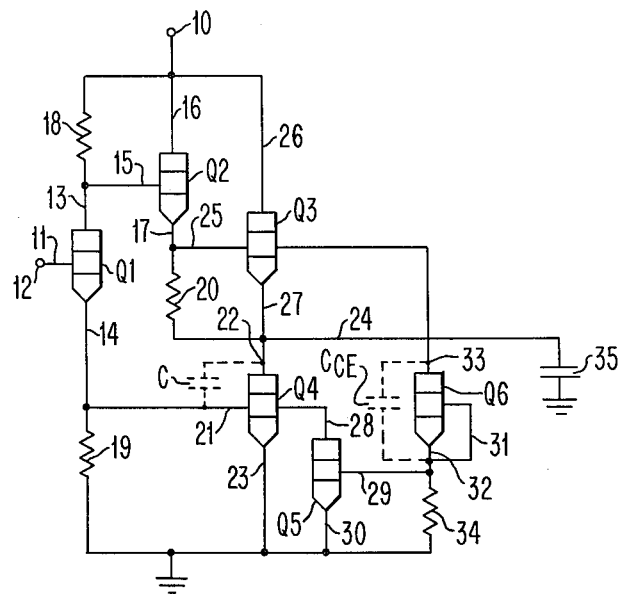
FIG. 2 shows the driver of FIG. 1 provided with the novel speed up circuit of the invention.

We will now consider the circuit of FIG. 1 when it is provided with the speed up circuit of the invention, as shown in FIG. 2.

FIG. 2 illustrates the NPN transistorized push pull amplifier circuit shown in FIG. 1 together with a speed up circuit added thereto that incorporates all the principle features of the present invention. In this description of FIG. 2 in the push pull amplifier circuit like numbers will refer to like components as shown in FIG. 1. This circuit thus comprises an input transistor Q1 whose base 11 is coupled to a source of input signals 12 and whose collector 13 is coupled through a collector resistor 18 to a +V voltage source 10 and directly to the base 15 of a reference transistor Q2. The collector 16 of the reference transistor Q2 is coupled directly to the voltage source 10. The emitter 17 of transistor Q2 is coupled, through an emitter resistor 20 to an output line 24 and also directly to the base 25 of an emitter follower transistor Q3 and to the collector 33 of a diode transistor Q6. The collector 26 of the emitter follower transistor Q3 is also coupled to the voltage source 10 while its emitter 27 is coupled directly to the output line 24.

Also coupled to the output line 24 is the collector 22 of a pull down transistor Q4. This pull down transistor Q4 has its emitter 23 coupled directly to ground and its base 21 coupled to the emitter 14 of the transistor Q1 which is coupled through an emitter resistor 19 to ground. The base 21 of the pull down transistor Q4 is also coupled to the collector 28 of a speed up transistor Q5 whose emitter 30 is connected to ground and whose base 29 is coupled through a diode here shown by diode-transistor Q6 to the base of transistor Q3. The transistor Q6 is coupled as a diode by connecting its base 31 to its emitter 32. The emitter 32 of transistor Q6 and the base 29 of the speed up transistor Q5 are both connected to ground through an emitter resistor 34. To the output line 24 is coupled a suitable load simulated by capacitor 35. It is thus clear that the transistors Q5 and Q6 as well as the emitter resistor 34 coupled to the base of the pull down transistor Q4 have been added to the circuit of FIG. 1 and comprise the speed up circuit of this invention.

Figure 4:
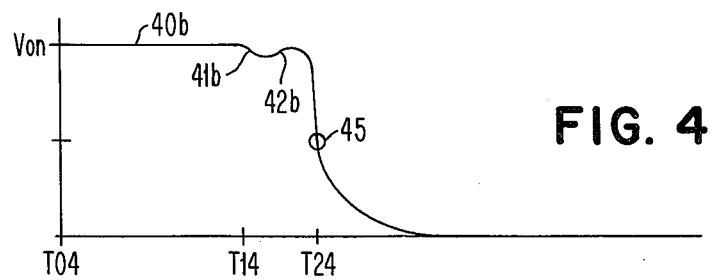
FIG. 4 is a plot of time vs drive voltage at the base of the pull down transistor of the circuit of FIG. 2.

The operation of the circuit of FIG. 2 will be now described in conjunction with the drive voltage time plot curve illustrated in FIG. 4 which shows that a significant change in the fall time of the drive voltage on the base 21 of transistor Q4 is achieved.

The curve shown in FIG. 4 depicts the drive voltage appearing at the base 21 of the pull down transistor Q4 when the speed up circuit of the invention is used.

For purposes of example only, it will be assumed that at time T04 transistor Q1 initially has a positive voltage signal impressed upon its base 11 such that it is in a conductive state and current is flowing through it from the positive voltage source 10 to ground. This current flow again causes the base of transistor Q2 to be held low such that transistor Q2 is in a nonconductive state as is the emitter follower transistor Q3.

This same current flowing through transistor Q1 further holds the base 21 of transistor Q4 at a high voltage level $V_{on}$ as indicated by the initial portions 40b of the curve of FIG. 4. Because the base 21 of transistor Q4 is held high, the transistor Q4 is also conductive and the output line 24 is held at a low voltage, i.e. substantially ground. The output line 24 will remain at this low voltage level as long as the input signal supplied to the base 11 of transistor Q4 remains conductive.

The sequence for switching the output line 24 to a positive or high voltage level +V is as follows:

At time T14, shown in FIG. 4, the positive voltage signal impressed upon the base 11 of transistor Q1 is pulled negative in amounts sufficient to render transistor Q1 nonconductive. When transistor Q1 becomes nonconductive its collector 13 and hence the base 15 of transistor Q2 rapidly rises toward the positive voltage level +V applied by source 10. This positive voltage thus appears as a D.C. pulse applied to the base 15 of transistor Q2 and causes the transistor Q2 to become conductive rapidly pulling up the base 25 of the emitter follower transistor Q3 to cause transistor Q3 to also turn on and thus apply a positive voltage from the positive voltage source +V at the source 10 to the output line 24.

Now, however, the application of voltage from source 10 to the base 25 of transistor Q3 through transistor Q2 is also now applied to the collector of transistor Q6. It is noted that the transistor Q6 has its collector 33 and its emitter 32 coupled by a phantom capacitor indicated by $C_{CE}$ which represents the collector to emitter capacitance of transistor Q6.

Although the diode transistor Q6 acts as a D.C. block to the pulse applied to the base 25 of transistor Q3 it will not block the A.C. components of the pulse. Thus immediately with the appearance of the pulse on base 25 and collector 33 the A.C. component of this pulse i.e. the leading edge of the pulse, causes a voltage, equal to the voltage appearing on collector 33 of transistor Q6, to appear on the emitter 32 of transistor Q6 and thus appear upon the base 29 of transistor Q5 causing transistor Q5 to become conductive. When transistor Q5 becomes conductive it couples the base 21 of transistor Q4 to ground.

Simultaneously, of course, at time T14 as transistor Q1 becomes nonconductive the base 21 of transistor Q4 is pulled toward ground causing the base drive voltage $V_{on}$ to fall as indicated by the portion 41b of the curve of FIG. 4. However, because the pull down transistor Q4 once again has a large interelectrode capacitance between its collector and the base 21 it will act as a source of drive voltage again returning the base 21 of transistor Q4 to the drive voltage $V_{on}$. Now, however, the speed up circuit comprising transistors Q5 and Q6 come into play causing the base 21 of transistor Q4 to be rapidly pulled toward ground. Because of the time constant of transistor Q1 and the propagation delay from the collector of Q1 to the base of transistor Q5 through devices Q2 and Q6 there still remains a slight delay of approximately 8 nanoseconds between time T14 and time T24 at which time the drive voltage on the base 21 of transistor Q4 is pulled down sufficiently, i.e. by 265 millivolts, to the point indicated by numeral 45 at which the transistor Q4 is rendered nonconductive.

Once again, of course, it is understood that the actual length of time transistor Q4 remains on is a function of the propagation delay of the signal from the collector 13 of transistor Q1 through transistor Q2 and Q6 to the base of Q5 as well as the inherent delay in the turning off transistor Q1 itself as to cause its emitter to become pulled toward ground. All of these factors add into the length of delay that will occur before the speed up circuit acts to pull the base 21 sufficiently low enough to cause the interelectrode capacitor C, across the collector and base of transistor Q4, to be discharged such that transistor Q4 can be rendered nonconductive.

If desired the collector 33 of the diode-transistor Q6 could be connected to the output line 24 instead of the base 25 of the emitter follower transistor 23. However, if the collector 33 of transistor Q6 is so connected to the output line the circuit is slightly slower than the circuit shown in FIG. 2.

Although the present invention has been described in conjunction with particular applications and embodiments hereof it is intended that all modifications, applications and embodiments which will be apparent to those skilled in the art in light of teachings of this invention be included within the spirit and scope of the invention and limited only by the following wherein claims wherein.

What is claimed is:

1. A circuit comprising:
    a pull up transistor having an emitter coupled to an output and a base,
    a pull down transistor having a base, an emitter and a collector, whose emitter is coupled to a reference potential and whose collector is coupled to said output, and
    a speed up circuit comprising a capacitor and a switching means coupled between said reference potential and the base of the pull down transistor for bringing down the base of the pull down transistor to said reference potential to render the pull down transistor nonconductive,
    said switching means having a control electrode connected through said capacitor to the base of said pull up transistor.

2. The circuit of claim 1 wherein said switching means comprises a speed up transistor having a base, an emitter and a collector, said speed up transistor having its collector connected to the base of said pull down transistor, its emitter coupled to said reference potential and its base connected through said capacitor to the base of said pull up transistor.

3. The circuit of claim 2 wherein said capacitor in said speed up circuit is a diode.

4. The circuit of claim 2 wherein said base of said speed up transistor is also coupled to said reference potential through an impedance.

5. An improved high speed push pull circuit comprising:
    an input transistor having an input and first and second outputs with its input connected to an input terminal,
    a first output transistor having an input and an output with its input coupled to the first output of the input transistor and its output connected to an output terminal,
    a second output transistor in series with said first output transistor having an input connected to the second output of said input transistor and an output connected to said output terminal, and
    a speed up transistor capacitively connected to the input of said first output transistor and directly connected to the input of said second output transistor to discharge the inherent interelectrode capacitance of the said output transistor and speed up the turn off response of said second output transistor.

6. The circuit of claim 5 wherein said speed up transistor is capacitively connected to the input of said first output transistor through a transistor having a base and an emitter coupled together and to the input of the speed up transistor and a collector coupled to the input of the first output transistor.

7. A driver circuit comprising:
an input transistor, having an emitter, a base, and a collector, coupled to an output transistor driving an output line,
a pull down transistor having a base connected to the emitter of the input transistor, an emitter connected to a reference potential, and a collector connected to the output line holding the output line at said reference potential in the absence of an input signal, and
a speed up circuit comprising capacitive means and a speed up transistor having a base connected to the output line through the capacitive means, a collector coupled to the base of the pull down transistor and an emitter connected to a reference potential for removing the storage charge from the base circuit of the pull down transistor when the pull down transistor is nonconductive to increase the turn off time of the pull down transistor and increase the rise time of the output line.

* * * * *